United States Patent
Kaitz et al.

(10) Patent No.: US 11,762,294 B2
(45) Date of Patent: Sep. 19, 2023

(54) COATING COMPOSITION FOR PHOTORESIST UNDERLAYER

(71) Applicant: ROHM AND HAAS ELECTRONIC MATERIALS LLC, Marlborough, MA (US)

(72) Inventors: Joshua Kaitz, Watertown, MA (US); Sheng Liu, Bow, NH (US); Li Cui, Westborough, MA (US); Shintaro Yamada, Shrewsbury, MA (US); Suzanne M. Coley, Mansfield, MA (US); Iou-Sheng Ke, Andover, MA (US)

(73) Assignee: ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 93 days.

(21) Appl. No.: 17/007,877

(22) Filed: Aug. 31, 2020

(65) Prior Publication Data

US 2022/0066320 A1    Mar. 3, 2022

(51) Int. Cl.
G03F 7/11    (2006.01)
G03F 7/09    (2006.01)

(52) U.S. Cl.
CPC ............ *G03F 7/11* (2013.01); *G03F 7/091* (2013.01); *G03F 7/094* (2013.01)

(58) Field of Classification Search
CPC . G03F 7/11; G03F 7/091; G03F 7/094; G03F 7/004; G03F 7/16; C09D 165/00; C09D 7/63; C09D 5/00; C09D 7/20; C09D 135/06; C08G 61/124; C08G 2261/124; C08G 2261/3241; C08L 65/00; H01L 21/0332; H01L 21/0337
See application file for complete search history.

(56) References Cited

U.S. PATENT DOCUMENTS

| | | | |
|---|---|---|---|
| 3,954,808 A | 5/1976 | Elliott et al. | |
| 4,681,923 A | 7/1987 | Demmer et al. | |
| 5,620,949 A | 4/1997 | Baker et al. | |
| 5,932,391 A * | 8/1999 | Ushirogouchi | G03F 7/0045 430/905 |
| 8,877,422 B2 | 11/2014 | Ogihara et al. | |
| 2004/0102586 A1* | 5/2004 | Leinweber | C08G 8/36 525/534 |

(Continued)

FOREIGN PATENT DOCUMENTS

| | | | |
|---|---|---|---|
| CN | 106118229 A | 11/2016 | |
| JP | 08202034 A | 8/1996 | |

(Continued)

OTHER PUBLICATIONS

Hernandez-Cruz et al. "High-Tg Functional Aromatic Polymers," Macromolecules vol. 48 pp. 1026-1037. Feb. 2015. (Year: 2015).*
Hernandez-Cruz, "High-Tg Functional Aromatic Polymers" Marcomolecules, 2015, 48, 1026-1037.
Zolotukhin et al. "Superacid-Catalyzed Polycondensation of Acenaphthenequinone with Aromatic Hydrocarbons", Macromolecules 2005, 38, 6005-6014.
English Translation of Korean Office Action for Application No. 10-2021-0107863 dated Jun. 27, 2023, 6 pages.

*Primary Examiner* — Mark F. Huff
*Assistant Examiner* — Moriah S. Smoot
(74) *Attorney, Agent, or Firm* — CANTOR COLBURN LLP

(57) ABSTRACT

A photoresist underlayer composition, comprising a polymer comprising a repeating unit of formula (1):

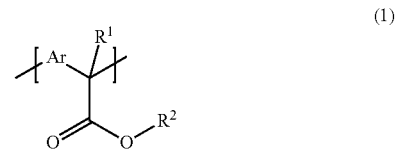

(1)

wherein Ar is a monocyclic or polycyclic $C_{5-60}$ aromatic group, wherein the aromatic group comprises one or more aromatic ring heteroatoms, a substituent group comprising a heteroatom, or a combination thereof; $R^1$ is hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl; and $R^2$ is substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl, wherein $R^1$ and $R^2$ can be optionally taken together to form a ring.

18 Claims, No Drawings

(56) References Cited

U.S. PATENT DOCUMENTS

| | | |
|---|---|---|
| 2009/0081590 A1 | 3/2009 | Shimbori |
| 2010/0119980 A1 | 5/2010 | Rahman et al. |
| 2012/0022211 A1 | 1/2012 | Jacobus Boonen et al. |
| 2012/0308939 A1 | 12/2012 | Kudo et al. |
| 2013/0280913 A1 | 10/2013 | Shinjo et al. |
| 2015/0166711 A1 | 6/2015 | Cui et al. |
| 2015/0315333 A1 | 11/2015 | Han et al. |
| 2015/0316850 A1 | 11/2015 | Someya et al. |
| 2017/0017156 A1 | 1/2017 | Ogihara et al. |
| 2017/0097568 A1 | 4/2017 | Endo et al. |
| 2018/0346635 A1* | 12/2018 | Imada .................... C08G 8/28 |
| 2019/0048129 A1 | 2/2019 | Nakasugi et al. |
| 2019/0367658 A1 | 12/2019 | Echigo |
| 2021/0116814 A1 | 4/2021 | Tokunaga et al. |
| 2022/0066321 A1 | 3/2022 | Kaitz et al. |

FOREIGN PATENT DOCUMENTS

| | | | | |
|---|---|---|---|---|
| JP | H08202034 A | * | 8/1996 | |
| JP | 11349654 A | | 12/1999 | |
| JP | 2001114853 A | * | 4/2001 | |
| JP | 2001114853 A | | 4/2001 | |
| JP | 2001255656 A | | 9/2001 | |
| JP | 2003238817 A | | 8/2003 | |
| JP | 2005221515 A | | 8/2005 | |
| KR | 20150117174 A | | 10/2015 | |
| WO | WO-2009115544 A1 | * | 9/2009 | .............. C08L 61/06 |
| WO | WO-2019048480 A1 | * | 3/2019 | .............. C08G 14/08 |
| WO | WO-2019137583 A1 | * | 7/2019 | ......... B29C 33/3807 |

* cited by examiner

COATING COMPOSITION FOR PHOTORESIST UNDERLAYER

FIELD

The present invention relates generally to field of manufacturing electronic devices, and more specifically to the field of materials for use in semiconductor manufacture.

BACKGROUND

Photoresist underlayer compositions are used in the semiconductor industry as etch masks for lithography in advanced technology nodes for integrated circuit manufacturing. These compositions are often used in tri-layer and quad-layer photoresist integration schemes, where an organic or silicon containing anti-reflective coating and a patternable photoresist film layers are disposed on the bottom layer having a high carbon content.

An ideal photoresist underlayer material should possess certain specific characteristics: it should be capable of being cast onto a substrate by a spin-coating process, should be thermally set upon heating with low out-gassing and sublimation, should be soluble in common solvents for good spin bowl compatibility, should have appropriate n & k values to work in conjunction with the anti-reflective coating layer to impart low reflectivity necessary for photoresist imaging, and should have high thermal stability to avoid being damaged during later processing steps. In addition to these requirements, the ideal photoresist underlayer material has to provide a planar film upon spin-coating and thermal curing over a substrate with topography and sufficient dry etch selectivity to silicon-containing layers located above and below the photoresist underlayer films in order to transfer the photo-patterns into the final substrate in an accurate manner.

Cross-linkable novolac resins have been used for underlayer applications. Novolacs are the product of condensation polymerization of one or more activated aromatic compounds with another monomer selected from aliphatic or aromatic carbonyl compounds, benzyl ethers, benzyl alcohols, or benzyl halides. The most widely studied novolac resins are the products of polycondensation of activated aromatic derivatives with formaldehyde-type or aromatic aldehyde co-monomers. These resins have found widespread application in a variety of lithographic compositions. An analogous class of resins are the products of polycondensation between activated aromatic derivatives with acid chlorides, where the resulting ketones are reduced to benzylic alcohols in a second step to afford highly soluble, cross-linkable materials.

There remains a need for new photoresist underlayer materials that can provide properties such as improved solubility, reduced cure temperature, high thermal stability, solvent resistance after cure, improved gap-fill, and improved planarization.

SUMMARY

Provided is a photoresist underlayer composition, comprising a polymer comprising a repeating unit of formula (1):

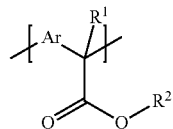

(1)

wherein Ar is a monocyclic or polycyclic $C_{5-60}$ aromatic group, wherein the aromatic group comprises one or more aromatic ring heteroatoms, a substituent group comprising a heteroatom, or a combination thereof; $R^1$ is hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl; and $R^2$ is substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl, wherein $R^1$ and $R^2$ can be optionally taken together to form a ring.

Also provided is a method of forming a pattern, the method comprising: (a) applying a layer of the photoresist underlayer composition on a substrate; (b) curing the applied photoresist underlayer composition to form a photoresist underlayer; and (c) forming a photoresist layer over the photoresist underlayer.

DETAILED DESCRIPTION

Reference will now be made in detail to exemplary embodiments, examples of which are illustrated in the present description. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes all combinations of one or more of the associated listed items. Expressions such as "at least one of," when preceding a list of elements, modify the entire list of elements and do not modify the individual elements of the list.

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise. All ranges disclosed herein are inclusive of the endpoints, and the endpoints are independently combinable with each other. The suffix "(s)" is intended to include both the singular and the plural of the term that it modifies, thereby including at least one of that term. "Optional" or "optionally" means that the subsequently described event or circumstance can or cannot occur, and that the description includes instances where the event occurs and instances where it does not. The terms "first," "second," and the like, herein do not denote an order, quantity, or importance, but rather are used to distinguish one element from another. When an element is referred to as being "on" another element, it may be directly in contact with the other element or intervening elements may be present therebetween. In contrast, when an element is referred to as being "directly on" another element, there are no intervening elements present. It is to be understood that the described components, elements, limitations, and/or features of aspects may be combined in any suitable manner in the various aspects.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "hydrocarbon group" refers to an organic compound having at least one carbon atom and at least one hydrogen atom, optionally substituted with one or more substituents where indicated; "alkyl group" refers to a straight or branched chain saturated hydrocarbon having the specified number of carbon atoms and having a valence of one; "alkylene group" refers to an alkyl group having a valence of two; "hydroxyalkyl group" refers to an alkyl group substituted with at least one hydroxyl group (—OH); "alkoxy group" refers to "alkyl-O—"; "carboxylic acid group" refers to a group having the formula "—C(=O)—OH"; "cycloalkyl group" refers to a monovalent group having one or more saturated rings in which all ring members are carbon; "cycloalkylene group" refers to a cycloalkyl group having a valence of two; "alkenyl group" refers to a straight or branched chain, monovalent hydrocarbon group having at least one carbon-carbon double bond; "alkenoxy group" refers to "alkenyl-O—"; "alkenylene group" refers to an alkenyl group having a valence of at least two; "cycloalkenyl group" refers to a cycloalkyl group having at least one carbon-carbon double bond; "alkynyl group" refers to a monovalent hydrocarbon group having at least one carbon-carbon triple bond; the term "aromatic group" denotes the conventional idea of aromaticity as defined in the literature, in particular in IUPAC 19, and refers to a monocyclic or polycyclic aromatic ring system that includes carbon atoms in the ring or rings, and optionally may include one or more heteroatoms independently selected from N, O, and S instead of a carbon atom or carbon atoms in the ring or rings; "aryl group" refers to a monovalent, monocyclic or polycyclic aromatic group containing only carbon atoms in the aromatic ring or rings, and may include a group with an aromatic ring fused to at least one cycloalkyl or heterocycloalkyl ring; "arylene group" refers to an aryl group having a valence of at least two; "alkylaryl group" refers to an aryl group that has been substituted with an alkyl group; "arylalkyl group" refers to an alkyl group that has been substituted with an aryl group; "aryloxy group" refers to "aryl-O—"; and "arylthio group" refers to "aryl-S—".

The prefix "hetero" means that the compound or group includes at least one member that is a heteroatom (e.g., 1, 2, 3, or 4 or more heteroatom(s)) instead of a carbon atom, wherein the heteroatom(s) is each independently selected from N, O, S, Si, or P; "heteroatom-containing group" refers to a substituent group that includes at least one heteroatom; "heteroalkyl group" refers to an alkyl group having 1-4 heteroatoms instead of carbon atoms; "heterocycloalkyl group" refers to a cycloalkyl group with one or more N, O or S atoms instead of carbon atoms; "heterocycloalkylene group" refers to a heterocycloalkyl group having a valence of at least two; "heteroaryl group" refers to an aryl group having 1 to 3 separate or fused rings with one or more N, O or S atoms as ring members instead of carbon atoms; and "heteroarylene group" refers to a heteroaryl group having a valence of at least two.

The term "halogen" means a monovalent substituent that is fluorine (fluoro), chlorine (chloro), bromine (bromo), or iodine (iodo). The prefix "halo" means a group including one more of a fluoro, chloro, bromo, or iodo substituent instead of a hydrogen atom. A combination of halo groups (e.g., bromo and fluoro), or only fluoro groups may be present.

The symbol "*" represents a bonding site (i.e., point of attachment) of a repeating unit.

"Substituted" means that at least one hydrogen atom on the group is replaced with another group, provided that the designated atom's normal valence is not exceeded. When the substituent is oxo (i.e., =O), then two hydrogens on the carbon atom are replaced. Combinations of substituents or variables are permissible. Exemplary groups that may be present on a "substituted" position include, but are not limited to, nitro (—$NO_2$), cyano (—CN), hydroxyl (—OH), oxo (=O), amino (—$NH_2$), mono- or di-($C_{1-6}$)alkylamino, alkanoyl (such as a $C_{2-6}$ alkanoyl group such as acyl), formyl (—C(=O)H), carboxylic acid or an alkali metal or ammonium salt thereof, $C_{2-6}$ alkyl ester (—C(=O)O-alkyl or —OC(=O)-alkyl), $C_{7-13}$ aryl ester (—C(=O)O-aryl or —OC(=O)-aryl), amido (—C(=O)$NR_2$ wherein R is hydrogen or $C_{1-6}$ alkyl), carboxamido (—$CH_2$C(=O)$NR_2$ wherein R is hydrogen or $C_{1-6}$ alkyl), halogen, thiol (—SH), $C_{1-6}$ alkylthio (—S-alkyl), thiocyano (—SCN), $C_{1-6}$ alkyl, $C_{2-6}$ alkenyl, $C_{2-6}$ alkynyl, $C_{1-6}$ haloalkyl, $C_{1-9}$ alkoxy, $C_{1-6}$ haloalkoxy, $C_{3-12}$ cycloalkyl, $C_{5-18}$ cycloalkenyl, $C_{6-12}$ aryl having at least one aromatic ring (e.g., phenyl, biphenyl, naphthyl, or the like, each ring either substituted or unsubstituted aromatic), $C_{7-19}$ arylalkyl having 1 to 3 separate or fused rings and from 6 to 18 ring carbon atoms, arylalkoxy having 1 to 3 separate or fused rings and from 6 to 18 ring carbon atoms, $C_{7-12}$ alkylaryl, $C_{4-12}$ heterocycloalkyl, $C_{3-12}$ heteroaryl, $C_{1-6}$ alkyl sulfonyl (—S(=O)$_2$-alkyl), $C_{6-12}$ arylsulfonyl (—S(=O)$_2$-aryl), or tosyl ($CH_3C_6H_4SO_2$—). When a group is substituted, the indicated number of carbon atoms is the total number of carbon atoms in the group, excluding those of any substituents. For example, the group —$CH_2CH_2$CN is a $C_2$ alkyl group substituted with a cyano group.

As noted above, there remains a continuing need for new photoresist underlayer materials that can provide properties such as improved solubility, reduced cure temperature, high thermal stability, solvent resistance after cure, improved gap-fill, and improved planarization.

The incorporation of carboxylate groups in a polymer unit of a photoresist underlayer material can substantially improve material solubility and lower cross-linking onset temperatures for curing, without significantly compromising etch resistance and reflectivity parameters. In particular, the inventive compositions disclosed herein achieve superior planarization performance and have etch rates that can be adjusted based on polymer structure. Photoresist underlayer compositions including the carboxylate-containing polymer may form crosslinks and/or may be crosslinkable, preferably wherein the polymer is crosslinkable without irradiation. For example, the photoresist underlayer composition of the present invention may include a thermal acid generator and preferably does not include a photoacid generator. The crosslinking may be via a crosslinking agent or by self-crosslinking.

According to an embodiment, a photoresist underlayer composition includes a polymer including a repeating unit of formula (1):

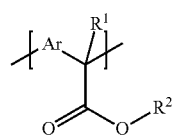

(1)

wherein, in formula (1), Ar is a monocyclic or polycyclic $C_{5-60}$ aromatic group, wherein the aromatic group comprises one or more aromatic ring heteroatoms, a substituent group comprising a heteroatom, or a combination thereof. For convenience, the monocyclic or polycyclic $C_{5-60}$ aromatic group can be referred to herein as "the Ar group." Typically, the one or more heteroatoms independently can be chosen from N, O, or S. When the $C_{5-60}$ aromatic group is polycyclic, the ring or ring groups can be fused (such as naphthyl or the like), directly linked (such as biaryls, biphenyl, or the like), and/or bridged by a heteroatom (such as triphenylamino or diphenylene ether). In an embodiment, the polycyclic aromatic group may include a combination of fused and directly linked rings (such as binaphthyl or the like). It is to be understand that the one or more heteroatoms of the monocyclic or polycyclic $C_{5-60}$ aromatic group may be present as aromatic ring members instead of carbon atoms (e.g., a heteroarylene group), as one or more heteroatoms of a heteroatom-containing substituent group (e.g., a hydroxyl substituent group), or a combination thereof.

The monocyclic or polycyclic $C_{5-60}$ aromatic group can be substituted or unsubstituted. Exemplary substituents include, but are not limited to, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, substituted or unsubstituted $C_{4-30}$ heteroarylalkyl, halogen, $-OR^{11}$, $-SR^{12}$, or $-NR^{13}R^{14}$, wherein $R^{11}$ to $R^{14}$ are each independently hydrogen, substituted or unsubstituted $C_{1-30}$ alkyl, substituted or unsubstituted $C_{3-30}$ cycloalkyl, substituted or unsubstituted $C_{2-30}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl.

In an embodiment, the monocyclic or polycyclic $C_{5-60}$ aromatic group may be a monocyclic or polycyclic $C_{6-60}$ arylene group or a monocyclic or polycyclic $C_{5-60}$ heteroarylene group. When the $C_{5-60}$ aromatic group is a monocyclic or polycyclic $C_{6-60}$ arylene group, at least one hydrogen atom is substituted for a heteroatom-containing substituent group, as detailed above, such as a $-OR^{11}$, $-SR^{12}$, or $-NR^{13}R^{14}$ wherein $R^{11}$ to $R^{14}$ are each independently hydrogen, substituted or unsubstituted $C_{1-30}$ alkyl, substituted or unsubstituted $C_{3-30}$ cycloalkyl, substituted or unsubstituted $C_{2-30}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl. Preferably, Ar is a polycyclic $C_{10-60}$ arylene group or a polycyclic $C_{7-60}$ heteroarylene group. Exemplary Ar groups include, but are not limited to, substituted or unsubstituted carbazolediyl, substituted phenylene, substituted biphenylene, substituted naphthylene, and substituted pyrenylene.

In an embodiment, the monocyclic or polycyclic $C_{5-60}$ aromatic group can be a monocyclic or polycyclic $C_{6-60}$ arylene group substituted with $-OR^{11}$, $-SR^{12}$, or $-NR^{13}R^{14}$, wherein $R^{11}$ to $R^{14}$ are each independently hydrogen, substituted or unsubstituted $C_{1-30}$ alkyl, substituted or unsubstituted $C_{3-30}$ cycloalkyl, substituted or unsubstituted $C_{2-30}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl. For example, the monocyclic or polycyclic $C_{5-60}$ aromatic group can be a monocyclic or polycyclic $C_{6-60}$ arylene group substituted with a hydroxyl group.

It is to be understood that when the "monocyclic or polycyclic $C_{6-60}$ arylene group" is polycyclic, the number of carbon atoms is sufficient for the group to be chemically feasible. For example, the "monocyclic or polycyclic $C_{6-60}$ arylene group" may refer to "a monocyclic $C_{6-60}$ arylene group or a polycyclic $C_{10-60}$ arylene group"; or, for example "a monocyclic $C_{6-30}$ arylene group or a polycyclic $C_{12-60}$ arylene group".

It is to be understood that when the "monocyclic or polycyclic $C_{5-60}$ heteroarylene group" is polycyclic, the number of carbon atoms is sufficient for the group to be chemically feasible. For example, the "monocyclic or polycyclic $C_{5-60}$ heteroarylene group" may refer to "a monocyclic $C_{5-60}$ heteroarylene group or a polycyclic $C_{10-60}$ heteroarylene group"; or, for example "a monocyclic $C_{5-30}$ heteroarylene group or a polycyclic $C_{12-60}$ heteroarylene group".

In formula (1), $R^1$ is hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl. Preferably, $R^1$ is hydrogen, $C_{1-10}$ alkyl, $C_{1-10}$ fluoroalkyl, $C_{6-12}$ aryl, or $C_{6-12}$ fluoroaryl, with hydrogen being typical.

In formula (1), $R^2$ is substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl. Preferably, $R^2$ is substituted or unsubstituted $C_{1-20}$ alkyl, substituted or unsubstituted $C_{1-20}$ heteroalkyl, substituted or unsubstituted $C_{3-20}$ cycloalkyl, substituted or unsubstituted $C_{2-20}$ heterocycloalkyl, substituted or unsubstituted $C_{2-20}$ alkenyl, substituted or unsubstituted $C_{2-20}$ alkynyl, substituted or unsubstituted $C_{6-24}$ aryl, or substituted or unsubstituted $C_{5-20}$ heteroaryl.

Optionally, $R^1$ and $R^2$ can be taken together to form a ring.

In an embodiment, the Ar group may be a group of formula (2):

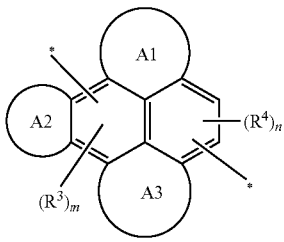

(2)

wherein A1, A2, and A3 each may be present or absent, and each independently represents 1 to 3 fused aromatic rings.

In formula (2), $R^3$ and $R^4$ are each independently substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl, halogen, —$OR^{21}$, —$SR^{22}$, or —$NR^{23}R^{24}$, provided that at least one of $R^3$ or $R^4$ is —$OR^{21}$, —$SR^{22}$, or —$NR^{23}R^{24}$.

In formula (2), $R^{21}$ to $R^{24}$ are each independently hydrogen, substituted or unsubstituted $C_{1-30}$ alkyl, substituted or unsubstituted $C_{3-30}$ cycloalkyl, substituted or unsubstituted $C_{2-30}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl.

In formula (2), m is an integer of 0 to 4 and n is an integer of 0 to 4, provided that the sum of m and n is an integer greater than 0. For example, the sum of m and n may be 1, 2, 3, or 4 or more, preferably 1 or 2.

In another embodiment, the Ar group may a group of formulae (3a), (3b), or (3c):

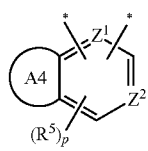

(3a)

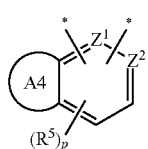

(3b)

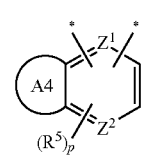

(3c)

wherein A4 may be present or absent and represents 1 to 3 fused aromatic rings. It is preferred that A4 represents 1 to 3 aromatic rings, and more preferably 1 to 2 fused aromatic rings, and most preferably 1 fused aromatic ring.

In formulae (3a), (3b), or (3c), $Z^1$ and $Z^2$ are each independently C or N, provided that A4 comprises at least one heteroaryl ring, at least one of $Z^1$ and $Z^2$ is N, or a combination thereof.

In formulae (3a), (3b), or (3c), each $R^5$ is independently substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl. In formulae (3a), (3b), and (3c), p is an integer of 0 to 4, typically 0 or 1.

In another embodiment, the Ar group may be a group of formula (4):

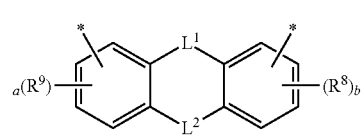

(4)

provided the Ar group comprises one or more aromatic ring heteroatoms, a substituent group comprising a heteroatom, or a combination thereof.

In formula (4), $L^1$ is a single bond, —O—, —S—, —S(O)—, —$SO_2$—, —C(O)—, —$CR^{41}R^{42}$—, —$NR^{43}$—, or —$PR^{44}$—, wherein $R^{41}$ to $R^{44}$ are each independently hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl. Preferably, $L^1$ is —O— or —$NR^{43}$—, more preferably —$NR^{43}$—.

In formula (4), $L^2$ is absent, a single bond, —O—, —S—, —S(O)—, —$SO_2$—, —C(O)—, substituted or unsubstituted $C_{1-2}$ alkylene, substituted or unsubstituted $C_{6-30}$ arylene, or substituted or unsubstituted $C_{5-30}$ heteroarylene. Preferably, $L^2$ is a single bond.

In formula (4), $R^8$ and $R^9$ are each independently substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl, halogen, —$OR^{45}$, —$SR^{46}$, or —$NR^{47}R^{48}$. In formula (4), a is an integer from 0 to 4, typically 0 to 2, more typically 0; and b is an integer from 0 to 4, typically 0 to 2, more typically 0.

In formula (4), $R^{41}$ to $R^{48}$ are each independently hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl.

The polymers of the invention may be prepared by reacting one or more monocyclic or polycyclic $C_{5-60}$ aromatic compounds (aromatic monomers) with one or more dicarbonyl compounds (dicarbonyl monomers) of formula (5), in the presence of an acid catalyst, and optionally in a suitable solvent.

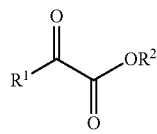

(5)

wherein $R^1$ is hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl. In formula (5), $R^2$ is hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl.

The aromatic monomer is a monocyclic or polycyclic $C_{5-60}$ aromatic compound, wherein the aromatic compound comprises one or more aromatic ring heteroatoms, a substituent group comprising a heteroatom, or a combination thereof. Exemplary $C_{5-60}$ aromatic compounds include, but are not limited to, substituted benzene, substituted biphenyl, substituted naphthalene, substituted binaphthyl, substituted anthracene, substituted benz[a]anthracene, substituted fluorene, substituted fluoranthene, substituted benzo[b]fluoranthene, substituted dibenzo(a,h)anthracene, substituted phenanthrene, substituted phenalene, substituted tetracene, substituted chrysene, substituted triphenylene, substituted pyrene, substituted pentacene, substituted benzo[a]pyrene, substituted corannulene, substituted benzoperylene, substituted coronene, substituted ovalene, substituted benzo[c]fluorene, substituted or unsubstituted benzothiophene, substituted or unsubstituted dibenzothiophene, substituted or unsubstituted carbazole, substituted or unsubstituted indole, substituted or unsubstituted quinoline, substituted or unsubstituted isoquinoline, substituted or unsubstituted purine, substituted or unsubstituted phenoxazine, substituted or unsubstituted phenothiazine, substituted or unsubstituted oxophenothiazine, substituted or unsubstituted dioxophenothiazine, or the like.

The monomers and optional solvent may be combined in any order. Acid catalyst is typically added to the reaction mixture after the monomers and any optional solvent. Following addition of the acid catalyst, the reaction mixture is typically heated, such as at reflux, for a period of time, such as from 1 to 48 hours. Following heating, the reaction product is isolated from the reaction mixture, such as by precipitation, and is typically dried, and optionally purified, before use. The molar ratio of total aromatic monomer to total dicarbonyl monomer is from 0.5:1 to 2:1, and typically from 1:1 to 1.5:1.

In an embodiment, the polymer is prepared without the use of an aldehyde or ketone compound other than the dicarbonyl compound of formula (5). For example, the polymer does not include a repeating unit derived from an aldehyde of the formula Ar'—CHO, where Ar' is a substituted or unsubstituted $C_{6-30}$ aromatic group.

A variety of solvents may be used to prepare the inventive polymers, such as, but not limited to, alcohols, glycol ethers, lactones, esters, ethers, ketones, water, and aromatic hydrocarbons. Preferably, a relatively polar solvent is used, such as alcohols, glycol ethers, lactones, esters, ethers, ketones, or water. Mixtures of solvents may be used. Exemplary solvents include, without limitation, methanol, ethanol, propanol, propylene glycol, propylene glycol monomethyl ether (PGME), propylene glycol dimethyl ether, diethylene glycol dimethyl ether, propylene glycol monomethyl ether acetate (PGMEA), gamma-butyrolactone (GBL), gamma-valerolactone, delta-valerolactone, ethyl lactate, 1,4-dioxane, cyclohexanone, cyclopentanone, methyl ethyl ketone, water, mesitylene, xylene, anisole, 4-methylanisole, and the like. Preferred solvents are methanol, ethanol, propanol, propylene glycol, propylene glycol monomethyl ether, propylene glycol dimethyl ether, propylene glycol monomethyl ether acetate, gamma-butyrolactone, gamma-valerolactone, delta-valerolactone, ethyl lactate, 1,4-dioxane, cyclohexanone, and water.

A variety of acids may suitably be used as catalysts in the preparation of the inventive polymers. Exemplary acids include, without limitation, organic carboxylic acids and dicarboxylic acids such as propionic acid and oxalic acid, mineral acids and sulfonic acids, and preferably the acid catalyst is a mineral acid or a sulfonic acid. Suitable mineral acids are HF, HCl, HBr, HNO$_3$, H$_2$SO$_4$, H$_3$PO$_4$, and HClO$_4$. Suitable sulfonic acids include alkane sulfonic acids and aryl sulfonic acids, such as methanesulfonic acid, ethane sulfonic acid, propane sulfonic acid, phenyl sulfonic acid, phenol sulfonic acid, para-toluenesulfonic acid, and cresol sulfonic acid. Preferred acid catalysts are HCl, HBr, HNO$_3$, H$_2$SO$_4$, H$_3$PO$_4$, methane sulfonic acid, ethane sulfonic acid, phenyl sulfonic acid, phenol sulfonic acid, and para-toluenesulfonic acid (pTSA).

In another embodiment, the polymer may include a repeating unit of formula (6):

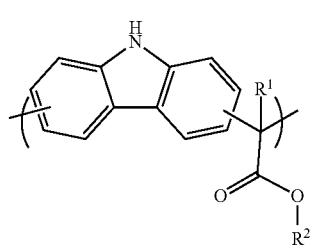

(6)

wherein $R^1$ and $R^2$ are as defined in formula (1).

The polymers of the invention typically have a weight average molecular weight ($M_w$) of 500 to 20000 Dalton (Da), preferably from 500 to 15000 Da, and more preferably from 500 to 10000 Da, as determined by gel permeation chromatography (GPC) using polystyrene standards.

The photoresist underlayer composition may further comprise a solvent, and optionally one or more additives chosen from curing agents, crosslinking agents, and surfactants. It will be appreciated by those skilled in the art that other additives may suitably be used in the present compositions.

The solvent may be an organic solvent typically used in the electronics industry, such as PGME, PGMEA, methyl 3-methoxypropionate (MMP), ethyl lactate, n-butyl acetate, anisole, N-methyl pyrrolidone, gamma-butyrolactone (GBL), ethoxybenzene, benzyl propionate, benzyl benzoate, cyclohexanone, cyclopentanone, propylene carbonate, xylene, mesitylene, cumene, limonene, and mixtures thereof. Typically, the total solids of the photoresist underlayer composition is from 0.5 to 20 wt % of the total weight of the photoresist underlayer composition, typically from 0.5 to 10 wt %, with the solvent accounting for the balance of the photoresist underlayer composition.

Optionally, the inventive photoresist underlayer composition may further comprise one or more curing agents to aid in the curing of the deposited polymer film. A curing agent is any component which causes curing of the photoresist underlayer composition on the surface of a substrate. Preferred curing agents are thermal acid generators (TAGs). A TAG is any compound which liberates acid upon exposure to heat. Thermal acid generators are well-known in the art and are generally commercially available, such as from King Industries, Norwalk, Conn. Exemplary thermal acid generators include, without limitation, amine blocked strong acids, such as amine blocked sulfonic acids such as amine blocked dodecylbenzenesulfonic acid. It will also be appreciated by those skilled in the art that certain photoacid generators are able to liberate acid upon heating and may function as thermal acid generators. The amount of such curing agents useful in the present compositions may be, for example, from greater than 0 to 10 wt %, and typically from greater than 0 to 3 wt % based on total solids of the photoresist underlayer composition.

Any suitable crosslinking agent may be used in the present compositions, provided that such crosslinking agent has at least 2, and preferably at least 3, moieties capable of reacting with the present polymer under suitable conditions, such as under acidic conditions. Exemplary crosslinking agents include, but are not limited to, novolac resins, epoxy-containing compounds, melamine compounds, guanamine compounds, isocyanate-containing compounds, benzocyclobutenes, benzoxazines, and the like, and typically any of the foregoing having 2 or more, more typically 3 or more substituents selected from methylol, $C_{1-10}$ alkoxymethyl, and $C_{2-10}$ acyloxymethyl. Examples of suitable crosslinking agents are those shown by formulae (7) and (8).

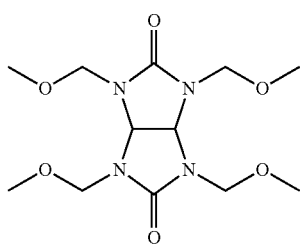

(7)

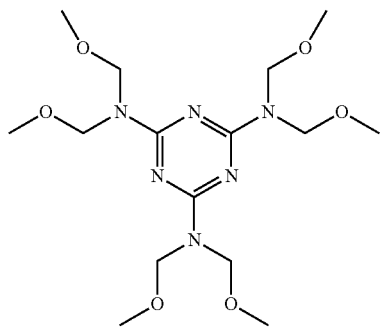

(8)

Such crosslinking agents are well-known in the art and are commercially available from a variety of sources. The amount of such crosslinking agents useful in the present compositions may be, for example, in the range of from greater than 0 to 30 wt %, and typically from greater than 0 to 10 wt % based on total solids of the composition.

The present photoresist underlayer compositions may optionally include one or more surface leveling agents (or surfactants) and antioxidants. Typical surfactants include those which exhibit an amphiphilic nature, meaning that they may be both hydrophilic and hydrophobic at the same time. Amphiphilic surfactants possess a hydrophilic head group or groups, which have a strong affinity for water and a long hydrophobic tail, which is organophilic and repels water. Suitable surfactants may be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA) and PF-656 (Omnova Solutions, Beachwood, Ohio, USA). Still further exemplary surfactants include alcohol (primary and secondary) ethoxylates, amine ethoxylates, glucosides, glucamine, polyethylene glycols, poly (ethylene glycol-co-propylene glycol), or other surfactants disclosed in McCutcheon's Emulsifiers and Detergents, North American Edition for the Year 2000 published by Manufacturers Confectioners Publishing Co. of Glen Rock, N.J. Nonionic surfactants that are acetylenic diol derivatives also may be suitable. Such surfactants are commercially available from Air Products and Chemicals, Inc. of Allentown, Pa. and sold under the trade names of SURFYNOL® and DYNOL®. Additional suitable surfactants include other polymeric compounds such as the tri-block EO-PO-EO co-polymers PLURONIC® 25R2, L121, L123, L31, L81, L101 and P123 (BASF, Inc.). Such surfactants if used may be present in the composition in minor amounts, for example from greater than 0 to 1 wt % based on total solids of the photoresist underlayer composition.

An antioxidant may be added to the composition to prevent or minimize oxidation of organic materials in the composition. Suitable antioxidants include, for example, phenol-based antioxidants, antioxidants composed of an organic acid derivative, sulfur-containing antioxidants, phosphorus-based antioxidants, amine-based antioxidants, antioxidant composed of an amine-aldehyde condensate and antioxidants composed of an amine-ketone condensate. Examples of the phenol-based antioxidant include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butylhydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethyl-amino-p-cresol, 6-(4-hydroxy-3,5-di-tert-butylanilino)2,4-bisoctyl-thio-1,3,5-triazine, n-octadecyl-3-(4'-hydroxy-3',5'-di-tert-butylphenyl)propionate, octylated phenol, aralkyl-substituted phenols, alkylated p-cresol and hindered phenol; bis-, tris- and poly-phenols such as 4,4'-dihydroxydiphenyl, methylenebis(dimethyl-4,6-phenol), 2,2'-methylene-bis-(4-methyl-6-tert-butylphenol), 2,2'-methylene-bis-(4-methyl-6-cyclohexylphenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-crosslinked polyvalent alkylphenol, 4,4'-butylidenebis-(3-methyl-6-tert-butylphenol), 1,1-bis-(4-hydroxyphenyl)-cyclohexane, 2,2'-dihydroxy-3,3'-di-(α-methylcyclohexyl)-5,5'-dimethyldiphenylmethane, alkylated bisphenol, hindered bisphenol, 1,3,5-trimethyl-2,4,6-tris(3,5-di-tert-butyl-4-hydroxybenzyl)benzene, tris-(2-methyl-4-hydroxy-5-tert-butylphenyl)butane, and tetrakis-[methylene-3-(3',5'-di-tert-butyl-4'-hydroxyphenyl)propionate]methane.

Suitable antioxidants are commercially available, for example, Irganox™ antioxidants (Ciba Specialty Chemicals Corp.). The antioxidant if used may be present in the composition in an amount, for example, of from greater than 0 to 1 wt % based on total solids of the photoresist underlayer composition.

Another aspect of the present invention provides a coated substrate, including a layer of the photoresist underlayer composition disposed on a substrate; and a photoresist layer disposed on the layer of the photoresist underlayer composition. The coated substrate may further include a silicon-containing layer and/or an organic antireflective coating layer disposed above the photoresist underlayer composition and below the photoresist layer.

Yet another aspect of the present invention provides a method of forming a pattern. The method includes: (a) applying a layer of the photoresist underlayer composition on a substrate; (b) curing the applied photoresist underlayer composition to form a photoresist underlayer; and (c) forming a photoresist layer over the photoresist underlayer. The method may further include forming a silicon-containing layer and/or an organic antireflective coating layer above the photoresist underlayer prior to forming the photoresist layer. The method may further include patterning the photoresist layer and transferring the pattern from the patterned photoresist layer to the photoresist underlayer and to a layer below the photoresist underlayer.

A wide variety of substrates may be used in the patterning methods, with electronic device substrates being typical. Suitable substrates include, for example, packaging substrates such as multichip modules; flat panel display substrates; integrated circuit substrates; substrates for light emitting diodes (LEDs) including organic light emitting diodes (OLEDs); semiconductor wafers; polycrystalline silicon substrates; and the like. Suitable substrates may be in the form of wafers such as those used in the manufacture of integrated circuits, optical sensors, flat panel displays, integrated optical circuits, and LEDs. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Such substrates may be any suitable size. Typical wafer substrate diameters are 200 mm to 300 mm, although wafers having smaller and larger diameters may be suitably employed according to the present invention. As used herein, the term "semiconductor substrate" includes any substrate having one or more semiconductor layers or structures which may optionally include active or operable portions of semiconductor devices. A semiconductor device refers to a semiconductor substrate upon which at least one microelectronic device has been or is being batch fabricated.

The substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. The substrate may include one or more layers and patterned features. The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers can be formed by various techniques, for example, chemical vapor deposition (CVD) such as plasma-enhanced CVD (PECVD), low-pressure CVD (LPCVD) or epitaxial growth, physical vapor deposition (PVD) such as sputtering or evaporation, or electroplating.

The photoresist underlayer composition may be coated on the substrate by any suitable means, such as spin-coating, slot-die coating, doctor blading, curtain-coating, roller-coating, spray-coating, dip-coating, and the like. In the case of a semiconductor wafer, spin-coating is preferred. In a typical spin-coating method, the photoresist underlayer compositions are applied to a substrate which is spinning at a rate of 500 to 4000 rpm for a period of 15 to 90 seconds to obtain a desired layer of the photoresist underlayer composition on the substrate. It will be appreciated by those skilled in the art that the thickness of the coated photoresist underlayer composition may be adjusted by changing the spin speed, as well as the total solids content of the photoresist composition. A photoresist underlayer formed from the photoresist underlayer composition typically has a dried layer thickness of from 5 nm to 50 μm, typically from 25 nm to 3 μm, and more typically from 50 to 500 nm. The photoresist underlayer composition may be applied to substantially fill, preferably fill, and more preferably fully fill, a plurality of gaps on the substrate.

The applied photoresist underlayer composition is optionally softbaked at a relatively low temperature to remove any solvent and other relatively volatile components from the composition. Exemplary baking temperatures may be from 60 to 170° C., although other suitable temperatures may be used. Such baking to remove residual solvent may be 10 seconds to 10 minutes, although longer or shorter times may suitably be used. When the substrate is a wafer, such baking step may be performed by heating the wafer on a hot plate.

The applied photoresist underlayer composition is then cured to form a photoresist underlayer. The photoresist underlayer composition should be sufficiently cured such that the photoresist underlayer does not intermix, or minimally intermixes, with a subsequently applied layer, such as a photoresist or other organic or inorganic layer disposed directly on the photoresist underlayer. The photoresist underlayer composition may be cured in an oxygen-containing atmosphere, such as air, or in an inert atmosphere, such as nitrogen and under conditions, such as heating, sufficient to provide a cured coating layer. This curing step is preferably conducted on a hot plate-style apparatus, although oven curing may be used to obtain equivalent results. The curing temperature should be sufficient to effect curing throughout the layer, for example, sufficient to allow a curing agent such as a free acid to effect crosslinking, or to allow a thermal acid generator to liberate acid and the liberated acid to effect crosslinking where the curing agent is a TAG. Typically, the curing is conducted at a temperature of 150° C. or greater, and preferably 150 to 450° C. It is more preferred that the curing temperature is 180° C. or greater, still more preferably 200° C. or greater, and even more preferably from 200 to 400° C. The curing time is typically from 10 seconds to 10 minutes, preferably from 30 seconds to 5 minutes, more preferably from 45 seconds to 5 minutes, and still more preferably from 45 to 90 seconds. Optionally, a ramped or a multi-stage curing process may be used. A ramped bake typically begins at a relatively low (e.g., ambient) temperature that is increased at a constant or vaned ramp rate to a higher target temperature. A multi-stage curing process involves curing at two or more temperature plateaus, typically a first stage at a lower bake temperature and one or more additional stages at a higher temperature. Conditions for such ramped or multi-stage curing processes are known to those skilled in the art, and may allow for omission of a preceding softbake process.

After curing of the photoresist underlayer composition, one or more processing layers, such as a photoresist layer, a hardmask layer such as a metal hardmask layer, an organic or inorganic BARC layer, and the like, may be disposed over the cured photoresist underlayer. A photoresist layer may be formed directly on the surface of the photoresist underlayer or, alternatively, may be formed above the photoresist underlayer on one or more intervening layers. In this case, one or more intervening processing layers such as described above can be sequentially formed over the photoresist underlayer followed by formation of the photoresist layer. Determination of suitable layers, thicknesses and coating methods are well known to those skilled in the art.

A wide variety of photoresists may be suitably used in the methods of the invention and are typically positive-tone materials. Suitable photoresists include, for example, materials within the EPIC™ series of photoresists available from DuPont Electronics & Imaging (Marlborough, Mass.). The photoresist can be applied to the substrate by known coating techniques such as described above with reference to the underlayer composition, with spin-coating being typical. A typical thickness for the photoresist layer is from 500 to 3000 Å. The photoresist layer is typically next softbaked to minimize the solvent content in the layer, thereby forming a tack-free coating and improving adhesion of the layer to the substrate. The softbake can be conducted on a hotplate or in an oven, with a hotplate being typical. Typical softbakes are conducted at a temperature of from 90 to 150° C., and a time of from 30 to 90 seconds.

Optionally, one or more barrier layers may be disposed on the photoresist layer. Suitable barrier layers include a topcoat layer, a top antireflectant coating layer (or TARC layer), and the like. Preferably, a topcoat layer is used when the photoresist is patterned using immersion lithography. Such topcoats are well-known in the art and are generally commercially available, such as OC™ 2000 available from DuPont Electronics & Imaging. It will be appreciated by those skilled in the art that a TARC layer is not needed when an organic antireflectant layer is used under the photoresist layer.

The photoresist layer is next exposed to activating radiation through a photomask to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions corresponding to regions of the resist layer to be exposed and unexposed, respectively, by the activating radiation. The exposure wavelength is typically sub-400 nm, sub-300 nm, such as 248 nm (KrF), 193 nm (ArF) or an EUV wavelength (e.g., 13.5 nm). In a preferred aspect, the exposure wavelength is 193 nm. The exposure energy is typically from 10 to 80 mJ/cm$^2$, depending, for example, on the exposure tool and the components of the photosensitive composition.

Following exposure of the photoresist layer, a post-exposure bake (PEB) is typically performed. The PEB can be conducted, for example, on a hotplate or in an oven. The PEB is typically conducted at a temperature of from 80 to 150° C., and a time of from 30 to 90 seconds. A latent image defined by the boundary between polarity-switched and unswitched regions (corresponding to exposed and unexposed regions, respectively) is thereby formed. The exposed photoresist layer is then developed using the appropriate developer to provide a patterned photoresist layer.

The pattern of the photoresist layer can then be transferred to one or more underlying layers including the photoresist underlayer and to the substrate by appropriate etching techniques, such as by plasma etching or wet etching. Plasma etching may use an appropriate gas species for each layer being etched. Suitable wet chemical etch chemistries include, for example, mixtures comprising ammonium hydroxide, hydrogen peroxide, and water (e.g., SC-1 clean); mixtures comprising hydrochloric acid, hydrogen peroxide, and water (e.g., SC-2 clean); mixtures comprising sulfuric acid, hydrogen peroxide, and water (e.g., SPM clean); mixtures comprising phosphoric acid, hydrogen peroxide, and water; mixtures comprising hydrofluoric acid and water; mixtures comprising hydrofluoric acid, phosphoric acid, and water; mixtures comprising hydrofluoric acid, nitric acid, and water; mixtures comprising tetramethylammonium hydroxide and water; and the like.

Depending on the number of layers and materials involved, pattern transfer may involve multiple etching steps using different techniques. The patterned photoresist layer, photoresist underlayer, and other optional layers in the lithographic stack may be removed following pattern transfer of the substrate using conventional techniques. Optionally, one or more of the layers of the stack may be removed, or is consumed, following pattern transfer to an underlying layer and prior to pattern transfer to the substrate. The substrate is then further processed according to known processes to form an electronic device.

The photoresist underlayer composition may also be used in a self-aligned double patterning process. In such a process, a layer of the photoresist underlayer composition described above is coated on a substrate, such as by spin-coating. Any remaining organic solvent is removed, and the coating layer is cured to form a photoresist underlayer. A suitable middle layer, such as a silicon-containing hardmask layer is optionally coated on the photoresist underlayer. A layer of a suitable photoresist is then coated on the middle layer, such as by spin coating. The photoresist layer is then imaged (exposed) and the exposed photoresist layer is then developed using the appropriate developer to provide a patterned photoresist layer. The pattern is next transferred from the photoresist layer to the middle layer and the photoresist underlayer by appropriate etching techniques to expose portions of the substrate. Typically, the photoresist is also removed during such etching step. Next, a conformal silicon-containing layer is disposed over the patterned photoresist underlayer and exposed portions of the substrate. Such silicon-containing layer is typically an inorganic silicon layer such as SiON or $SiO_2$ which is conventionally deposited by CVD. Such conformal coatings result in a silicon-containing layer on the exposed portions of the substrate surface as well as over the photoresist underlayer pattern, that is, such silicon-containing layer substantially covers the sides and top of the photoresist underlayer pattern. Next, the silicon-containing layer is partially etched (trimmed) to expose a top surface of the patterned photoresist underlayer and a portion of the substrate. Following this partial etching step, the pattern on the substrate comprises a plurality of features, each feature comprising a line or post of the photoresist underlayer with the silicon-containing layer directly adjacent to the sides of each photoresist underlayer feature. Next, exposed regions of the photoresist underlayer are removed, such as by etching, to expose the substrate surface that was under the photoresist underlayer pattern, and providing a patterned silicon-containing layer on the substrate surface, where such patterned silicon-containing layer is doubled (that is, twice as many lines and/or posts) as compared to the original patterned photoresist underlayer.

Photoresist underlayers formed from the inventive photoresist underlayer compositions show excellent planarization, good solvent resistance, and tunable etch rates. Preferred photoresist underlayer compositions of the invention may, as a result, be useful in a variety of semiconductor manufacturing processes The present inventive concept is further illustrated by the following examples. All compounds and reagents used herein are available commercially except where a procedure is provided below.

EXAMPLES

Polymer Synthesis

Synthesis Example 1

To a round bottom flask were added 10.0 g of carbazole (1.5 equiv.), 3.67 g of glyoxylic acid monohydrate (1 equiv.), and 50 mL of propylene glycol monomethyl ether acetate (PGMEA). The reaction mixture was warmed to 60° C. and stirred for 5 minutes (min), followed by addition of 0.30 g of methane sulfonic acid in one portion. The reaction was then heated to 120° C. for 16 hours (h). After this reaction time, the reaction mixture was cooled to room temperature and poured into 9/1 (v/v) of methanol/water to give a solid polymer product. The product was filtered and washed with methanol, then air-dried for 4 h and vacuum-dried at 50° C. for an additional 20 h to give Synthesis Example 1 (P-1). (66% yield, Mw=2220, PDI=1.9).

Synthesis Example 2

To a round bottom flask were added 5.0 g of carbazole (1.5 equiv.), 1.85 g of glyoxylic acid monohydrate (1 equiv.), 6.65 g of 1-butanol (3 equiv.), and 15 mL of 1,4-dioxane. The reaction mixture was warmed to 60° C. and stirred for 5 min, followed by addition of 1.45 g of methane sulfonic acid in one portion. The reaction was then heated to 100° C. for 16 h. After this reaction time, the reaction mixture was cooled to room temperature and poured into 9/1 (v/v) methanol/water to give a solid polymer product. The product was filtered off and washed with methanol, then air-dried for 4 h and vacuum-dried at 50° C. for an additional 20 h to give Synthesis Example 2 (P-2). (87% yield, Mw=1510, PDI=1.4).

Synthesis Examples 3 to 6

Synthesis Examples 3 (P-3) to 6 (P-6) were prepared with the same procedure as above and with the respective alcohols (P-3: octanol; P-4: 2-(2-Methoxyethoxy)ethanol; P-5: benzyl alcohol; P-6: 3,7-dimethyl-1-octanol) to get the desired polymers.

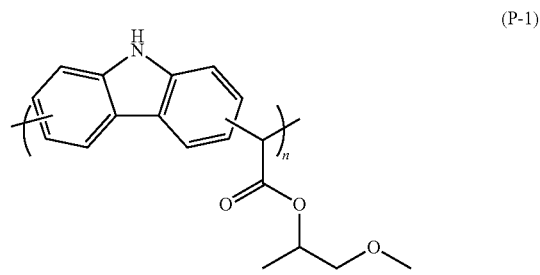

(P-1)

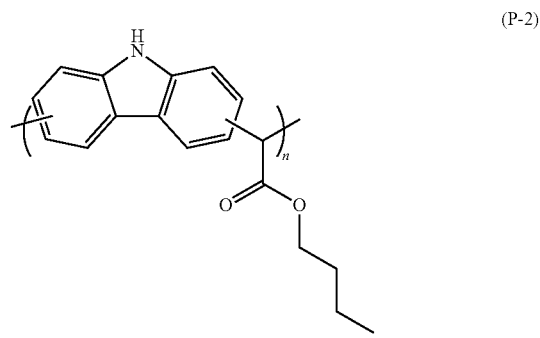

(P-2)

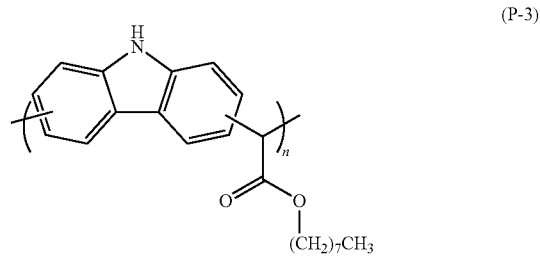

(P-3)

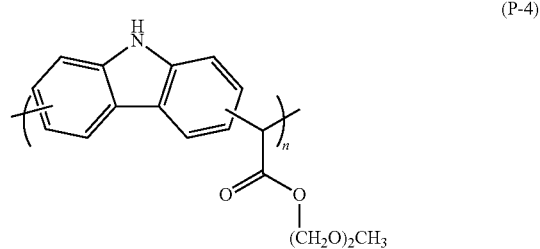

(P-4)

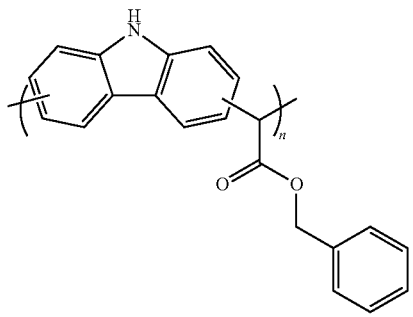
(P-5)

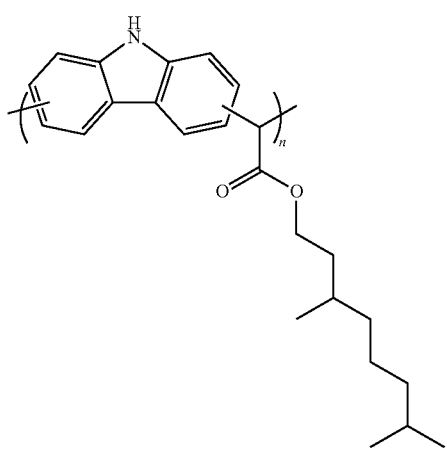
(P-6)

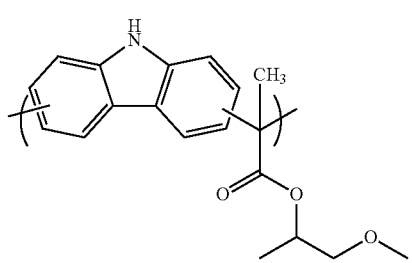
(P-7)

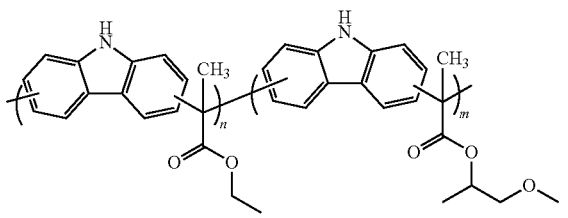
(P-8)

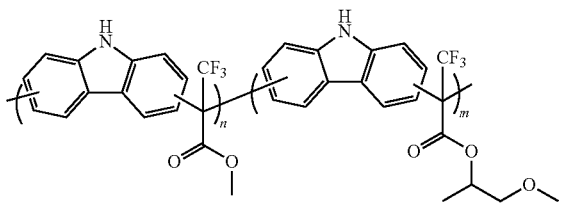
(P-9)

Synthesis Example 7

To a round bottom flask were added 6.0 g of carbazole (1.25 equiv.), 2.53 g of pyruvic acid (1 equiv.), and 25 mL of PGMEA. The reaction mixture was warmed to 60° C. and stirred for 5 min, followed by addition of 1.70 g of methane sulfonic acid in one portion. The reaction was then heated to 120° C. for 16 h. After this reaction time, the reaction mixture was cooled to room temperature and poured into 9/1 (v/v) methanol/water to give a solid polymer product. The product was filtered off and washed in excess methanol, then air-dried for 4 h and vacuum-dried at 50° C. for an additional 20 h to give Synthesis Example 7 (P-7). (76% yield, Mw=3080, PDI=1.7).

Synthesis Example 8

To a round bottom flask were added 6.0 g of carbazole (1.25 equiv.), 3.33 g of ethyl pyruvate (1 equiv.), and 25 mL of PGMEA. The reaction mixture was warmed to 60° C. and stirred for 5 min, followed by addition of 1.70 g of methane sulfonic acid in one portion. The reaction was then heated to 120° C. for 16 h. After this reaction time, the reaction mixture was cooled to room temperature and poured into 9/1 (v/v) methanol/water to give a solid polymer product. The product was filtered off and washed in excess methanol, then air-dried for 4 h and vacuum-dried at 50° C. for an additional 20 h to give Synthesis Example 8 (P-8). (67% yield, Mw=2630, PDI=1.5).

Synthesis Example 9

To a round bottom flask were added 5.0 g of carbazole (1.5 equiv.), 3.11 g of methyl trifluoromethyl pyruvate (1 equiv.), and 20 mL of PGMEA. The reaction mixture was warmed to 60° C. and stirred for 5 min, followed by addition of 1.50 g of methane sulfonic acid in one portion. The reaction was then heated to 120° C. for 16 h. After this reaction time, the reaction mixture was cooled to room temperature and poured into 9/1 (v/v) methanol/water to give a solid polymer product. The product was filtered off and washed in excess methanol, then air-dried for 4 h and vacuum-dried at 50° C. for an additional 20 h to give Synthesis Example 9 (P-9). (65% yield, Mw=10200, PDI=2.9).

Synthesis Example 10

To a round bottom flask were added 6.0 g of carbazole (1.5 equiv.), 3.59 g of phenyl glyoxylic acid (1 equiv.), and 25 mL of PGMEA. The reaction mixture was warmed to 60° C. and stirred for 5 min, followed by addition of 1.70 g of methane sulfonic acid in one portion. The reaction was then heated to 120° C. for 16 h. After this reaction time, the reaction mixture was cooled to room temperature and poured into 9/1 (v/v) methanol/water to give a solid polymer product. The product was filtered off and washed in excess methanol, then air-dried for 4 h and vacuum-dried at 50° C. for an additional 20 h to give Synthesis Example 10 (P-10). (40% yield, Mw=1250, PDI=1.2).

Synthesis Example 11

To a round bottom flask were added 10.0 g of 1-naphthol (1.2 equiv.), 5.32 g of glyoxylic acid monohydrate (1 equiv.), and 40 mL of PGMEA. The reaction mixture was warmed to 60° C. and stirred for 5 min, followed by addition of 3.35 g of methane sulfonic acid in one portion. The reaction was then heated to 120° C. for 20 h. After this reaction time, the reaction mixture was cooled to room temperature and poured into 9/1 (v/v) methanol/water to give a solid polymer product. The product was filtered off and washed in excess methanol, then air-dried for 4 h and vacuum-dried at 50° C. for an additional 20 h to give Synthesis Example 11 (P-11). (88% yield, Mw=3640, PDI=2.0).

Synthesis Example 12

To a round bottom flask were added 10.0 g of 1-naphthol (1.2 equiv.), 5.32 g of glyoxylic acid monohydrate (1 equiv.), 15.5 g of 1-butanol (3 equiv.) and 25 mL 1,4-dioxane. The reaction mixture was warmed to 60° C. and stirred for 5 min, followed by addition of 3.35 g of methane sulfonic acid in one portion. The reaction was then heated to 100° C. for 16 h. After this reaction time, the reaction mixture was cooled to room temperature and poured into 9/1 (v/v) methanol/water to give a solid polymer product. The product was filtered off and washed in excess methanol, then air-dried for 4 h and vacuum-dried at 50° C. for an additional 20 h to give Synthesis Example 12 (P-12). (59% yield, Mw=1750, PDI=1.4).

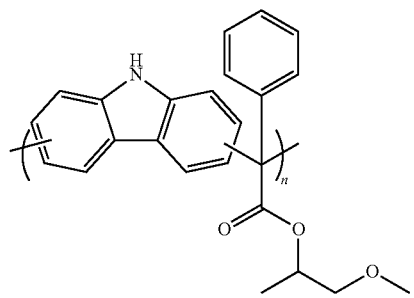
(P-11)

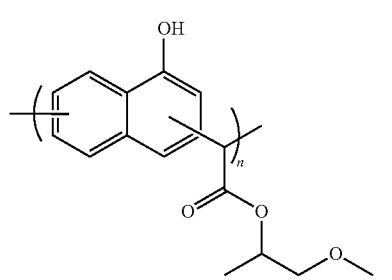
(P-12)

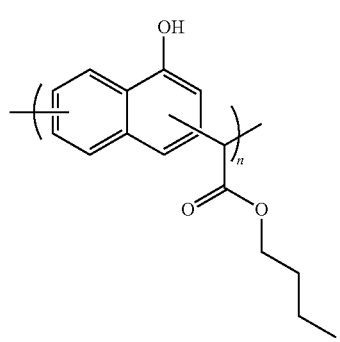

Synthesis Example 13

To a round bottom flask were added 6.0 g of 1-naphthol (1.5 equiv.), 2.45 g of pyruvic acid (1 equiv.), and 25 mL of PGMEA. The reaction mixture was warmed to 60° C. and stirred for 5 min, followed by addition of 2.00 g of methane sulfonic acid in one portion. The reaction was then heated to 120° C. for 20 h. After this reaction time, the reaction mixture was cooled to room temperature and poured into 9/1 (v/v) methanol/water to give a solid polymer product. The product was filtered off and washed in excess methanol, then air-dried for 4 h and vacuum-dried at 50° C. for an additional 20 h to give Synthesis Example 13 (P-13). (59% yield, Mw=810, PDI=1.5).

Synthesis Example 14

To a round bottom flask were added 6.0 g of 1-naphthol (1.5 equiv.), 3.22 g of ethyl pyruvate (1 equiv.), and 25 mL of PGMEA. The reaction mixture was warmed to 60° C. and stirred for 5 min, followed by addition of 2.00 g of methane sulfonic acid in one portion. The reaction was then heated to 120° C. for 16 h. After this reaction time, the reaction mixture was cooled to room temperature and poured into 9/1 (v/v) methanol/water to give a solid polymer product. The product was filtered off and washed in excess methanol, then air-dried for 4 h and vacuum-dried at 50° C. for an additional 20 h to give Synthesis Example 14 (P-14). (70% yield, Mw=1010, PDI=1.7).

Synthesis Example 15

To a round bottom flask were added 5.0 g of 1-pyrenol (1.5 equiv.), 1.40 g of glyoxylic acid monohydrate (1 equiv.), and 20 mL of PGMEA. The reaction mixture was warmed to 60° C. and stirred for 5 min, followed by addition of 1.30 g of methane sulfonic acid in one portion. The reaction was then heated to 120° C. for 20 h. After this reaction time, the reaction mixture was cooled to room temperature and poured into 9/1 (v/v) methanol/water to give a solid polymer product. The product was filtered off and washed in excess methanol, then air-dried for 4 h and vacuum-dried at 50° C. for an additional 20 h to give Synthesis Example 15 (P-15). (62% yield, Mw=1790, PDI=1.6).

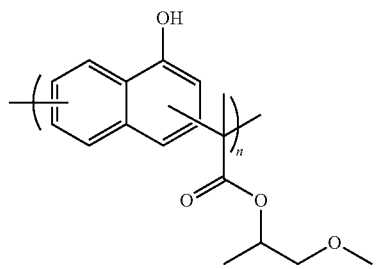
(P-13)

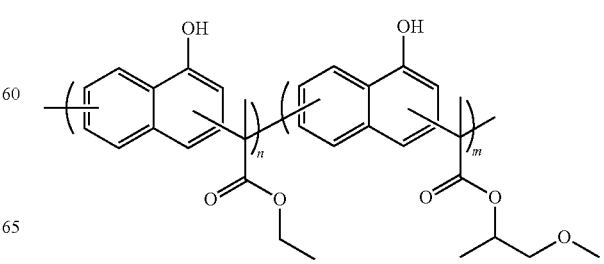
(P-14)

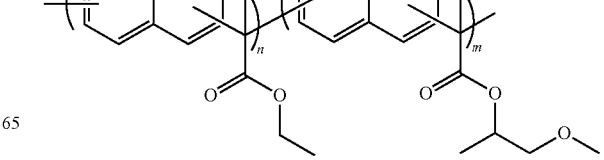

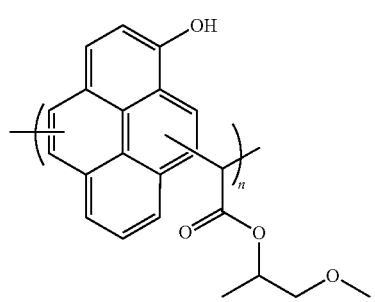
(P-15)

Comparative Polymer Synthesis

Comparative Synthesis Example 1

To a round bottom flask were added 5.0 g of carbazole (1.5 equiv.), 0.60 g of paraformaldehyde (1 equiv.), and 20 mL of PGMEA. The reaction mixture was warmed to 60° C. and stirred for 5 min, followed by addition of 1.45 g of methane sulfonic acid in one portion. The reaction was then heated to 120° C. for 16 h. After this reaction time, the reaction mixture was cooled to room temperature and poured into 9/1 (v/v/) methanol/water to give a solid polymer product. The product was filtered off and washed in excess methanol, then air-dried for 4 h and vacuum-dried at 50° C. for an additional 20 h to give Comparative Synthesis Example 1 (CP-1). (80% yield, Mw=2730, PDI=2.5).

Comparative Synthesis Example 2

To a round bottom flask were added 5.0 g of carbazole (1.5 equiv.), 1.85 g of glyoxylic acid monohydrate (1 equiv.), and 25 mL of 1,4-dioxane. The reaction mixture was warmed to 60° C. and stirred for 5 min, followed by addition of 1.45 g of methane sulfonic acid in one portion. The reaction was then heated to 100° C. for 16 h. After this reaction time, the reaction mixture was cooled to room temperature and poured into 9/1 (v/v) methanol/water to give a solid polymer product. The product was filtered off and washed in excess methanol, then air-dried for 4 h and vacuum-dried at 50° C. for an additional 20 h to give Comparative Synthesis Example 2 (CP-2). (58% yield, Mw=1610, PDI=1.3).

Comparative Synthesis Example 3

To a round bottom flask were added 5.0 g of 1-naphthol (1 equiv.), 1.04 g of paraformaldehyde (1 equiv.), and 25 mL of PGMEA. The reaction mixture was warmed to 60° C. and stirred for 5 min, followed by addition of 0.20 g of methane sulfonic acid in one portion. The reaction was then heated to 120° C. for 16 h. After this reaction time, the reaction mixture was cooled to room temperature and poured into 9/1 (v/v) methanol/water to give a solid polymer product. The product was filtered off and washed in excess water and methanol, then air-dried for 4 h and vacuum-dried at 50° C. for an additional 20 h to give Comparative Synthesis Example 3 (CP-3). (52% yield, Mw=2240, PDI=2.0).

Comparative Synthesis Example 4

To a round bottom flask were added 5.0 g of 1-pyrenol (1 equiv.), 0.69 g of paraformaldehyde (1 equiv.), and 20 mL of propylene glycol monomethyl ether (PGME). The reaction mixture was warmed to 60° C. and stirred for 5 min, followed by addition of 2.20 g of methane sulfonic acid in one portion. The reaction was then heated to 120° C. for 1 h. After this reaction time, the reaction mostly solidified. The solid was taken from the flask and washed in excess water and methanol, then air-dried for 4 h and vacuum-dried at 50° C. for an additional 20 h to give Comparative Synthesis Example 4 (CP-4).

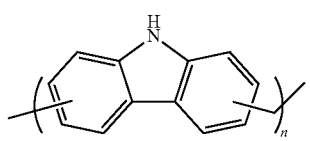
(CP-1)

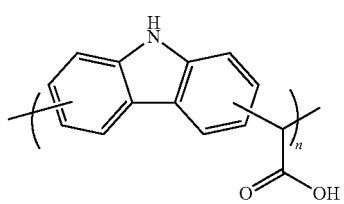
(CP-2)

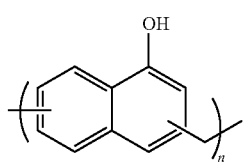
(CP-3)

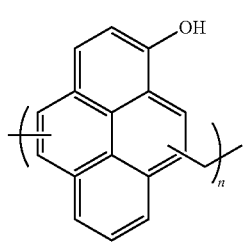
(CP-4)

Physical Testing

Number and weight-average molecular weights, $M_n$ and $M_w$, respectively, and polydispersity (PDI) values ($M_w/M_n$) for the polymers were measured by gel permeation chromatography (GPC) on an Agilent 1100 series LC system equipped with an Agilent 1100 series refractive index and MiniDAWN light scattering detector (Wyatt Technology Co.). Samples were dissolved in HPLC grade THF at a concentration of approximately 10 mg/mL and filtered through at 0.45 μm syringe filter, then injected through four Shodex columns (KF805, KF804, KF803 and KF802). A flow rate of 1 mL/min and temperature of 35° C. were maintained. The columns were calibrated with narrow molecular weight PS standards (EasiCal PS-2, Polymer Laboratories, Inc.).

Differential scanning calorimetry (DSC) was used to determine glass transition temperatures on bulk polymer. Samples (1-3 mg) were heated to and left at 150° C. for 10 min to remove residual solvent on the first cycle, then cooled to 0° C. and ramped back up to 300° C. at a heating rate of 10° C./min. The second heating curve and reversible heating curves were used to identify glass transition temperatures.

Table 1 shows the molecular weight, solubility, and thermal characterization for polymers P-1 to P-10 and comparative polymers CP-1 and CP-2.

TABLE 1

| Example | $M_w$ | PDI | Solubility[a] | $T_g$ (° C.)[b] |
|---|---|---|---|---|
| P-1 | 2220 | 1.9 | +++ | 164 |
| P-2 | 1510 | 1.4 | +++ | 108 |
| P-3 | 1930 | 1.4 | +++ | 67 |
| P-4 | 1760 | 1.5 | +++ | 114 |
| P-5 | 1540 | 1.4 | +++ | 84 |
| P-6 | 1980 | 1.4 | +++ | 29 |
| P-7 | 3080 | 1.7 | +++ | 166 |
| P-8 | 2360 | 1.5 | +++ | 157 |
| P-9 | 10200 | 2.9 | +++ | N/A |
| P-10 | 1250 | 1.2 | +++ | N/A |
| CP-1 | 2730 | 2.5 | X | N/A |
| CP-2 | 1610 | 1.3 | X | N/A |

[a]Solubility measured at 10 wt % in PGMEA. +++ indicates full dissolution, X indicates minimal or no dissolution at this concentration.
[b]Measured by DSC, heating rate 10° C./min; N/A indicates "not observed".

Table 2 shows the molecular weight, solubility, and thermal characterization for polymers P-11 to P-15 and comparative polymers CP-3 and CP-4.

TABLE 2

| Example | $M_w$ | PDI | Solubility[a] | $T_g$ (° C.)[b] |
|---|---|---|---|---|
| P-11 | 3640 | 2.0 | +++ | 177 |
| P-12 | 1750 | 1.4 | +++ | 156 |
| P-13 | 810 | 1.5 | +++ | 117 |
| P-14 | 1010 | 1.7 | +++ | 141 |
| P-15 | 1790 | 1.6 | +++ | 186 |
| CP-3 | 2240 | 2.0 | +++ | N/A |
| CP-4 | — | — | X | N/A |

[a]Solubility measured at 10 wt % in PGMEA. +++ indicates full dissolution, X indicates minimal or no dissolution at this concentration.
[b]Measured by DSC, heating rate 10° C./min; N/A indicates "not observed".

As can be seen from Tables 1 and 2, the inventive compositions have better solubility and lower glass transition temperatures compared to comparative examples.

Formulations

Photoresist underlayer compositions were prepared by combining the polymers set forth in Tables 1 and 2 with components outlined in Table 3 to form photoresist underlayer compositions. The compositions were filtered through a 0.2 μm PTFE syringe filter prior to coating. The amounts of Polymer 1, Polymer 2, Additive 1, Additive 2, and solvents are listed in grams (g).

TABLE 3

| Example | Polymer 1 | Polymer 2 | Additive 1 | Additive 2 | Solvents |
|---|---|---|---|---|---|
| E-1 | P-1 (4.1) | | B-1 (0.34) | C-1 (0.05) | D-1/D-2 (92.6/2.9) |
| E-2 | P-2 (4.1) | | B-1 (0.34) | C-1 (0.05) | D-1/D-2 (92.6/2.9) |
| E-3 | P-3 (4.1) | | B-1 (0.34) | C-1 (0.05) | D-1/D-2 (92.6/2.9) |
| E-4 | P-1 (4.2) | | B-1 (0.34) | | D-1/D-2 (92.6/2.9) |
| E-5 | P-2 (4.2) | | B-1 (0.34) | | D-1/D-2 (92.6/2.9) |
| E-6 | P-3 (4.2) | | B-1 (0.34) | | D-1/D-2 (92.6/2.9) |
| E-7 | P-5 (4.2) | | B-1 (0.34) | | D-1/D-2 (92.6/2.9) |
| CE-1 | CP-3 (4.2) | | B-1 (0.34) | | D-1/D-2 (92.6/2.9) |
| CE-2 | CP-3 (3.4) | A-1 (0.8) | B-1 (0.27) | | D-1/D-2 (92.6/2.9) |

The structures of polymer A-1, additive B-1, additive C-1, solvent D-1, and solvent D-2 are as follows.

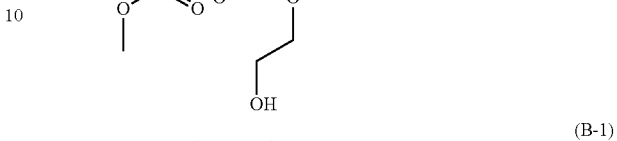

(A-1)

(B-1)

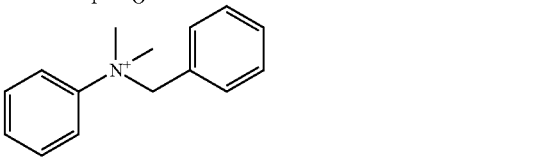

(C-1)

(D-1)

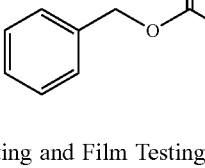

(D-2)

Coating and Film Testing

The photoresist underlayer compositions were coated at 100-200 nm and baked at 240° C. for 60 s. Film thickness was measured by ellipsometry.

Solvent Resistance

Solvent resistance was measured as an indication of film crosslinking. Compositions were coated and baked on 8-inch silicon wafers using an ACT-8 Clean Track (Tokyo Electron Co.). Film thickness was measured with OptiProbe™ from Therma-wave Co. Propylene glycol monomethyl ether acetate (PGMEA) was applied onto the films for 90 s followed by a post strip bake (PSB) at 105° C. for 60 s. The solvent resistance was calculated according to Equation 1:

[(FT before strip)−(FT after PSB)]/(FT before strip)*100%     Equation 1 wherein FT is film thickness. Solvent resistance is reported in Table 5, where A is defined as 99-100% solvent resistance and B is defined as 90-99% solvent resistance.

Etch Rate

The etch rates were determined for the photoresist underlayer compositions that were coated and baked on a 8-inch silicon wafer at film thickness of 100-200 nm. A Plasma-Therm 700+ Series etching tool was used to determine bulk film dry etch rates using conditions shown in Table 4. The cured photoresist underlayer compositions were etched using either $O_2$ or $CF_4$ plasma. Film thickness before and after etch was measured as a function of time and etch rate was calculated. Etch rates for the photoresist underlayer compositions are shown in Table 5.

TABLE 4

| Gas | $CF_4$ | $Ar/O_2$ |
|---|---|---|
| Flow (sccm) | 50 | 60/20 |
| Power (W) | 500 | 300 |
| Pressure (mT) | 10 | 10 |
| Time (s) | 30, 60, 120 | 30, 60, 90 |

Planarization Test

The photoresist underlayer composition of the invention were evaluated to determine their planarization properties. Templates were created at CNSE Nano-FAB (Albany, N.Y.). The template had $SiO_2$ film thickness of 100 nm, and various pitch and patterns with die size of 1 cm×1 cm. Each die started with a 100 nm isolated step pattern followed by a 2000 μm non-pattern open area, followed by various line/space patterns that covered 45 nm/90 nm to 2 μm/5 μm pitch trenches. The first step pattern was used to judge planarization performance. The template coupons were baked at 150° C. for 60 seconds as a dehydration bake prior to coating the coupons with the present compositions. Each photoresist underlayer composition was coated on a template coupon using a spin coater and a spin rate of 1500 rpm+/−200 rpm. The target film thickness was 100 nm after curing, and the composition dilution was adjusted accordingly to give approximately the target film thickness after curing. The films were cured by placing the wafer on a hot plate at 240° C. for 60 sec. Planarization quality of the films across a step was evaluated by KLA Tencor P-7 stylus profilometer.

In Table 5, planarization quality is defined as follows: A indicates a change in height of less than 20 nm, B indicates a change in height of between 20-28 nm, and C indicates a change in height of greater than 28 nm. Lower numbers indicate superior planarization performance, so A represents best planarization, followed by B, and C represents worst planarization performance.

TABLE 5

| Example | Solvent resistance | Planarization | Etch rate (Å/s, $Ar/O_2$) | Etch rate (Å/s, $CF_4$) |
|---|---|---|---|---|
| E-1 | A | B | | |
| E-2 | A | B | | |
| E-3 | B | A | 13.2 | 4.9 |
| E-4 | A | A | | |
| E-5 | A | A | | |
| E-6 | B | A | 13.3 | 4.9 |
| E-7 | A | B | 9.7 | 3.9 |
| CE-1 | A | C | | |
| CE-2 | A | C | 11.8 | 4.7 |

As can be seen from Table 5, the inventive photoresist underlayer compositions have superior planarization performance and have etch rates that can be tuned to be higher, lower, or matched, by blending or mixing resins, to comparative compositions.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A photoresist underlayer composition, comprising:
a polymer comprising a repeating unit of formula (1); and
a crosslinking agent:

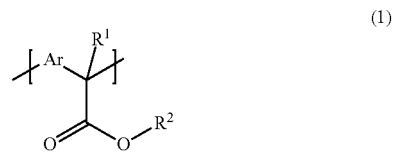

(1)

wherein
Ar is a monocyclic or polycyclic $C_{5-60}$ aromatic group, wherein the $C_{5-60}$ aromatic group comprises one or more aromatic ring heteroatoms, a substituent group comprising a heteroatom, or a combination thereof;
$R^1$ is hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl; and
$R^2$ is substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl,
wherein $R^1$ and $R^2$ can be optionally taken together to form a ring,
wherein the photoresist underlayer composition is free of a photoacid generator.

2. The photoresist underlayer composition of claim 1, wherein Ar is a monocyclic or polycyclic $C_{5-60}$ heteroarylene group or a monocyclic or polycyclic $C_{6-60}$ arylene group, optionally substituted with at least one of substituted or unsubstituted $C_{1-30}$ alkyl, substituted or unsubstituted $C_{1-30}$ haloalkyl, substituted or unsubstituted $C_{3-30}$ cycloalkyl, substituted or unsubstituted $C_{1-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, substituted or unsubstituted $C_{4-30}$ heteroarylalkyl, halogen, —$OR^{11}$, —$SR^{12}$, or —$NR^{13}R^{14}$, wherein $R^{11}$ to $R^{14}$ are each independently hydrogen, substituted or unsubstituted $C_{1-30}$ alkyl, substituted or unsubstituted $C_{3-30}$ cycloalkyl, substituted or unsubstituted $C_{2-30}$ heterocycloalkyl, substituted or unsubstituted C$_{6-30}$ aryl, substituted or unsubstituted C$_{7-30}$ arylalkyl, substituted or unsubstituted C$_{3-30}$ heteroaryl, or substituted or unsubstituted C$_{4-30}$ heteroarylalkyl,
provided that the monocyclic or polycyclic C$_{6-60}$ arylene group is substituted with at least one substituent group comprising a heteroatom.

3. The photoresist underlayer composition of claim 1, wherein Ar comprises a group of formula (2):

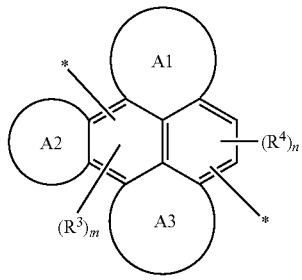

(2)

wherein,
A1, A2, and A3 each may be present or absent, and each independently represents 1 to 3 fused aromatic rings;
R$^3$ and R$^4$ are each independently substituted or unsubstituted C$_{1-30}$ alkyl, substituted or unsubstituted C$_{1-30}$ heteroalkyl, substituted or unsubstituted C$_{3-30}$ cycloalkyl, substituted or unsubstituted C$_{2-30}$ heterocycloalkyl, substituted or unsubstituted C$_{2-30}$ alkenyl, substituted or unsubstituted C$_{2-30}$ alkynyl, substituted or unsubstituted C$_{6-30}$ aryl, substituted or unsubstituted C$_{7-30}$ arylalkyl, substituted or unsubstituted C$_{7-30}$ alkylaryl, substituted or unsubstituted C$_{3-30}$ heteroaryl, or substituted or unsubstituted C$_{4-30}$ heteroarylalkyl, halogen, —OR$^{21}$, —SR$^{22}$, or —NR$^{23}$R$^{24}$; and
provided that at least one of R$^3$ or R$^4$ is —OR$^{21}$, —SR$^{22}$, or —NR$^{23}$R$^{24}$;
R$^{21}$ to R$^{24}$ are each independently hydrogen, substituted or unsubstituted C$_{1-30}$ alkyl, substituted or unsubstituted C$_{3-30}$ cycloalkyl, substituted or unsubstituted C$_{2-30}$ heterocycloalkyl, substituted or unsubstituted C$_{6-30}$ aryl, substituted or unsubstituted C$_{7-30}$ arylalkyl, substituted or unsubstituted C$_{3-30}$ heteroaryl, or substituted or unsubstituted C$_{4-30}$ heteroarylalkyl;
m is an integer 0 to 4;
n is an integer 0 to 4; and
provided that the sum of m and n is an integer greater than 0.

4. The photoresist underlayer composition of claim 1, wherein Ar comprises a group of formulae (3a), (3b), or (3c):

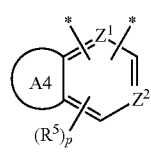

(3a)

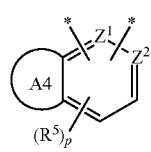

(3b)

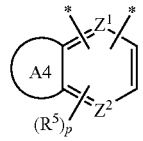

(3c)

wherein,
A4 may be present or absent, and represents 1 to 3 fused aromatic rings;
Z$^1$ and Z$^2$ are each independently C or N;
each R$^5$ is independently substituted or unsubstituted C$_{1-30}$ alkyl, substituted or unsubstituted C$_{1-30}$ heteroalkyl, substituted or unsubstituted C$_{3-30}$ cycloalkyl, substituted or unsubstituted C$_{2-30}$ heterocycloalkyl, substituted or unsubstituted C$_{2-30}$ alkenyl, substituted or unsubstituted C$_{2-30}$ alkynyl, substituted or unsubstituted C$_{6-30}$ aryl, substituted or unsubstituted C$_{7-30}$ arylalkyl, substituted or unsubstituted C$_{7-30}$ alkylaryl, substituted or unsubstituted C$_{3-30}$ heteroaryl, or substituted or unsubstituted C$_{4-30}$ heteroarylalkyl; and
p is an integer of 0 to 4,
wherein A4 comprises at least one heteroaryl ring, at least one of Z$^1$ and Z$^2$ is N, or a combination thereof.

5. The photoresist underlayer composition of claim 1, wherein Ar comprises a group of formula (4):

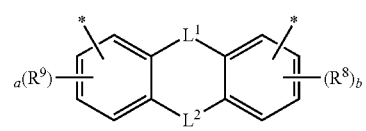

(4)

wherein,
L$^1$ is a single bond, —O—, —S—, —S(O)—, —SO$_2$—, —C(O)—, —CR$^{41}$R$^{42}$—, —NR$^{43}$—, or —PR$^{44}$—;
L$^2$ is absent, a single bond, —O—, —S—, —S(O)—, —SO$_2$—, —C(O)—, substituted or unsubstituted C$_{1-2}$ alkylene, substituted or unsubstituted C$_{6-30}$ arylene, or substituted or unsubstituted C$_{5-30}$ heteroarylene;
R$^8$ and R$^9$ are each independently substituted or unsubstituted C$_{1-30}$ alkyl, substituted or unsubstituted C$_{1-30}$ heteroalkyl, substituted or unsubstituted C$_{3-30}$ cycloalkyl, substituted or unsubstituted C$_{2-30}$ heterocycloalkyl, substituted or unsubstituted C$_{2-30}$ alkenyl, substituted or unsubstituted C$_{2-30}$ alkynyl, substituted or unsubstituted C$_{6-30}$ aryl, substituted or unsubstituted C$_{7-30}$ arylalkyl, substituted or unsubstituted C$_{7-30}$ alkylaryl, substituted or unsubstituted C$_{3-30}$ heteroaryl, or substituted or unsubstituted C$_{4-30}$ heteroarylalkyl, halogen, —OR$^{45}$, —SR$^{46}$, or —NR$^{47}$R$^{48}$;
R$^{41}$ to R$^{48}$ are each independently hydrogen, substituted or unsubstituted C$_{1-30}$ alkyl, substituted or unsubstituted C$_{1-30}$ heteroalkyl, substituted or unsubstituted C$_{3-30}$ cycloalkyl, substituted or unsubstituted C$_{2-30}$ heterocycloalkyl, substituted or unsubstituted C$_{6-30}$ aryl, substituted or unsubstituted C$_{7-30}$ arylalkyl, substituted or unsubstituted C$_{3-30}$ heteroaryl, or substituted or unsubstituted C$_{4-30}$ heteroarylalkyl;

a is an integer of 0 to 4; and b is an integer of 0 to 4.

6. The photoresist underlayer composition of claim 1, wherein the monocyclic or polycyclic $C_{5-60}$ aromatic group is a monocyclic or polycyclic $C_{6-60}$ arylene group substituted with hydroxyl.

7. The photoresist underlayer composition of claim 1, wherein the polymer comprises a repeating unit of formula (6):

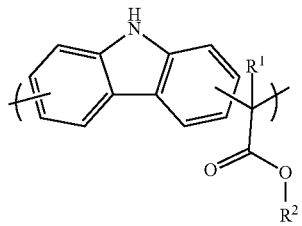

(6)

wherein $R^1$ and $R^2$ are as defined in any one of claims 1 to 6.

8. The photoresist underlayer composition of claim 1, further comprising one or more of a curing agent, and a surfactant.

9. A method of forming a pattern, the method comprising: (a) applying a layer of the photoresist underlayer composition of claim 1 on a substrate; (b) curing the applied photoresist underlayer composition to form a photoresist underlayer; and (c) forming a photoresist layer over the photoresist underlayer.

10. The method of claim 9, further comprising forming a silicon-containing layer, an organic antireflective coating layer, or a combination thereof, above the photoresist underlayer prior to forming the photoresist layer.

11. The method of claim 9, further comprising patterning the photoresist layer and transferring a pattern from the patterned photoresist layer to the photoresist underlayer and to a layer below the photoresist underlayer.

12. The method of claim 9, wherein in the polymer comprising the repeating unit of formula (1), Ar is a monocyclic or polycyclic $C_{5-60}$ heteroarylene group or a monocyclic or polycyclic $C_{6-60}$ arylene group, optionally substituted with at least one of substituted or unsubstituted $C_{1-30}$ alkyl, substituted or unsubstituted $C_{1-30}$ haloalkyl, substituted or unsubstituted $C_{3-30}$ cycloalkyl, substituted or unsubstituted $C_{1-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, substituted or unsubstituted $C_{4-30}$ heteroarylalkyl, halogen, —$OR^{11}$, —$SR^{12}$, or —$NR^{13}R^{14}$, wherein $R^{11}$ to $R^{14}$ are each independently hydrogen, substituted or unsubstituted $C_{1-30}$ alkyl, substituted or unsubstituted $C_{3-30}$ cycloalkyl, substituted or unsubstituted $C_{2-30}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl, provided that the monocyclic or polycyclic $C_{6-60}$ arylene group is substituted with at least one substituent group comprising a heteroatom.

13. The method of claim 9, wherein in the polymer comprising the repeating unit of formula (1), Ar comprises a group of formula (2):

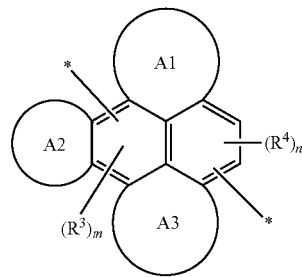

(2)

wherein,

A1, A2, and A3 each may be present or absent, and each independently represents 1 to 3 fused aromatic rings;

$R^3$ and $R^4$ are each independently substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl, halogen, —$OR^{21}$, —$SR^{22}$, or —$NR^{23}R^{24}$; and provided that at least one of $R^3$ or $R^4$ is —$OR^{21}$, —$SR^{22}$, or —$NR^{23}R^{24}$;

$R^{21}$ to $R^{24}$ are each independently hydrogen, substituted or unsubstituted $C_{1-30}$ alkyl, substituted or unsubstituted $C_{3-30}$ cycloalkyl, substituted or unsubstituted $C_{2-30}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl;

m is an integer 0 to 4;

n is an integer 0 to 4; and provided that the sum of m and n is an integer greater than 0.

14. The method of claim 9, wherein in the polymer comprising the repeating unit of formula (1), wherein Ar comprises a group of formulae (3a), (3b), or (3c):

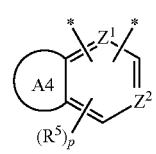

(3a)

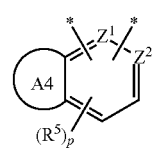

(3b)

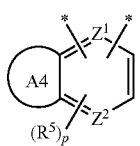

(3c)

wherein,

A4 may be present or absent, and represents 1 to 3 fused aromatic rings;

$Z^1$ and $Z^2$ are each independently C or N;

each $R^5$ is independently substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl; and p is an integer of 0 to 4, wherein A4 comprises at least one heteroaryl ring, at least one of $Z^1$ and $Z^2$ is N, or a combination thereof.

15. The method of claim 9, wherein in the polymer comprising the repeating unit of formula (1), Ar comprises a group of formula (4):

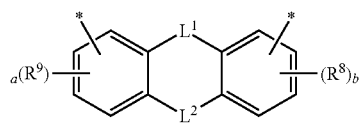

(4)

wherein, $L^1$ is a single bond, —O—, —S—, —S(O)—, —SO$_2$—, —C(O)—, —CR$^{41}$R$^{42}$—, —NR$^{43}$—, or —PR$^{44}$—;

$L^2$ is absent, a single bond, —O—, —S—, —S(O)—, —SO$_2$—, —C(O)—, substituted or unsubstituted $C_{1-2}$ alkylene, substituted or unsubstituted $C_{6-30}$ arylene, or substituted or unsubstituted $C_{5-30}$ heteroarylene;

$R^8$ and $R^9$ are each independently substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl, halogen, —OR$^{45}$, —SR$^{46}$, or —NR$^{47}$R$^{48}$;

$R^{41}$ to $R^{48}$ are each independently hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl;

a is an integer of 0 to 4; and b is an integer of 0 to 4.

16. The method of claim 9, wherein in the polymer comprising the repeating unit of formula (1), the monocyclic or polycyclic $C_{5-60}$ aromatic group is a monocyclic or polycyclic $C_{6-60}$ arylene group substituted with hydroxyl.

17. The method of claim 9, wherein the polymer comprises a repeating unit of formula (6):

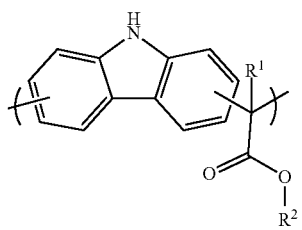

(6)

wherein $R^1$ and $R^2$ are as defined in any one of claims 1 to 6.

18. The method of claim 9, wherein the photoresist underlayer composition further comprises one or more of a curing agent, and a surfactant.

* * * * *